United States Patent
Okuni et al.

(10) Patent No.: US 11,493,612 B2
(45) Date of Patent: Nov. 8, 2022

(54) ELECTRONIC APPARATUS AND DISTANCE MEASURING METHOD

(71) Applicant: KABUSHIKI KAISHA TOSHIBA, Tokyo (JP)

(72) Inventors: Hidenori Okuni, Yokohama Kanagawa (JP); Tuan Thanh Ta, Kawasaki Kanagawa (JP); Satoshi Kondo, Kawasaki Kanagawa (JP); Akihide Sai, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 697 days.

(21) Appl. No.: 16/289,490

(22) Filed: Feb. 28, 2019

(65) Prior Publication Data
US 2020/0064450 A1 Feb. 27, 2020

(30) Foreign Application Priority Data
Aug. 27, 2018 (JP) .............................. JP2018-158698

(51) Int. Cl.
*G01S 7/4861* (2020.01)
*G01S 7/4865* (2020.01)
*G01S 17/26* (2020.01)
*H01L 31/107* (2006.01)

(52) U.S. Cl.
CPC .......... *G01S 7/4861* (2013.01); *G01S 7/4866* (2013.01); *G01S 17/26* (2020.01); *H01L 31/107* (2013.01)

(58) Field of Classification Search
None
See application file for complete search history.

(56) References Cited

U.S. PATENT DOCUMENTS

| 2017/0184709 | A1* | 6/2017 | Kienzler | G01S 7/487 |
| 2019/0033453 | A1* | 1/2019 | Crouch | G01S 7/484 |
| 2019/0063915 | A1* | 2/2019 | Hinderling | G01S 7/487 |
| 2019/0086542 | A1* | 3/2019 | Kubota | G01S 17/26 |

FOREIGN PATENT DOCUMENTS

| JP | 2014-13737 A | 1/2014 |
| JP | 2018-9831 A | 1/2018 |

\* cited by examiner

*Primary Examiner* — Eric L Bolda
(74) *Attorney, Agent, or Firm* — Foley & Lardner LLP

(57) ABSTRACT

According to one embodiment, an electronic apparatus includes a light source, a detector, an equalizer and a processing circuitry. The light source is configured to emit a pulse having a first output value and a first frequency response. The detector is configured to detect a reflected wave of the pulse and convert the reflected wave to a first electric signal. The reflected wave of the pulse is received after the pulse is reflected by an object. The equalizer is configured to equalize the first electric signal using tap coefficients to generate a second electric signal. The tap coefficients are based on at least either one of the first output value and the first frequency response. The processing circuitry is configured to estimate a distance to the object based on the second electric signal.

17 Claims, 16 Drawing Sheets

INPUT AND OUTPUT SIGNALS OF
THE EQUALIZER

ELECTRONIC APPARATUS AND DISTANCE MEASURING METHOD

CROSS-REFERENCE TO RELATED APPLICATIONS

This application is based upon and claims the benefit of priority from Japanese Patent Application No. 2018-158698, filed on Aug. 27, 2018; the entire contents of which are hereby incorporated by reference.

FIELD

Embodiments described herein relate generally to an electronic apparatus and a distance measuring method.

BACKGROUND

Recently, technology for measuring long distances by using photodetectors such as avalanche photo diodes (APDs) operating in Geiger mode is being developed. APDs operating in Geiger mode enable detections of each photon. In measurements of long distances, photodetectors with high sensitivities are used. However, during distance measurements, it is difficult to distinguish photons originating from light sources such as lasers and photons originating from ambient light.

In APDs operating in Geiger mode, transient responses may occur when the photon is detected. In such cases, the detected waveforms would be different from the pulse shapes of the original light source. Development of technology which minimizes the impact of ambient light during distance measurements is required.

DETAILED DESCRIPTION

According to one embodiment, an electronic apparatus includes a light source, a detector, an equalizer and a processing circuitry. The light source is configured to emit a pulse having a first output value and a first frequency response. The detector is configured to detect a reflected wave of the pulse and convert the reflected wave to a first electric signal. The reflected wave of the pulse is received after the pulse is reflected by an object. The equalizer is configured to equalize the first electric signal using tap coefficients to generate a second electric signal. The tap coefficients are based on at least either one of the first output value and the first frequency response. The processing circuitry is configured to estimate a distance to the object based on the second electric signal.

Hereinafter, embodiments of the present invention will be described with reference to the drawings.

First Embodiment

Figure 1:
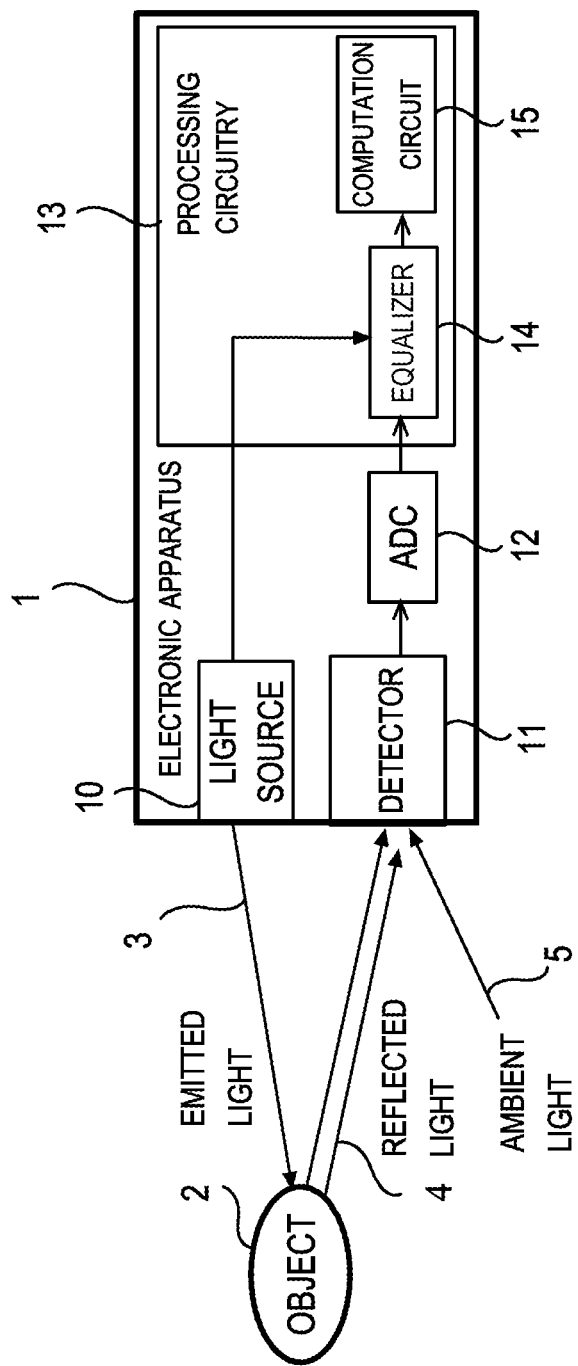
FIG. 1 is a block diagram describing a configuration example of an electronic apparatus according to a first embodiment.

FIG. 1 is a block diagram describing a configuration example of an electronic apparatus according to a first embodiment. An electronic apparatus according to a first embodiment will be described with reference to FIG. 1. The electronic apparatus 1 in FIG. 1 measures the distance between the electronic apparatus 1 and an object 2. Thus, the electronic apparatus 1 is a distance measuring device. The electronic apparatus 1 includes a light source 10, an A/D converter (ADC) 12 and a processing circuitry 13. The processing circuitry 13 includes an equalizer 14 and a computation circuit 15 as internal components.

The light source 10 is a device which emits a pulse of electromagnetic waves to the object 2. Here, the pulse has a certain length of time. The light source 10 can be a combination of a laser light source such as laser diodes and a circuit configured to generate a pulse (pulse generation circuit). Also, the light source 10 can be a combination of a LED and the pulse generation circuit. The light source 10 can be a combination of any type of lamp and the pulse generation circuit. Also, any type of device can be used to generate the electromagnetic waves.

The frequency band of the electromagnetic wave emitted by the light source 10 is not limited. Examples of the electromagnetic wave emitted by the light source 10 include infrared rays, near-infrared rays, visible light, ultra-violet rays or the combination of above. Thus, the light source 10 can be an infrared source, a near-infrared source or a ultra-violet (UV) source. In the following, an example when electromagnetic waves including visible light components are emitted from the light source 10 is described. An electromagnetic wave including visible light components is referred to as a "light".

The information of the pulse shape of the light emitted by the light source 10 is shared with the equalizer 14. This information is called the pulse shape information. For example, if light with approximately rectangular shaped pulses are emitted by the light source 10, the pulse width (for example, 10 nanometers) is shared with the equalizer 14 as the pulse shape information. Any method can be used to share the pulse shape information. For example, if the pulse shape of the light emitted by the light source 10 is fixed, the pulse shape information can be configured in the equalizer 14 during the manufacturing process of the electronic apparatus 1. Also, the light source 10 and the equalizer 14 can be electrically connected. Then, the equalizer 14 can access the pulse shape information stored in the light source 10. If the pulse shape of the light emitted by the light source 10 is changed, the equalizer 14 can obtain the updated pulse shape information.

The emitted light 3 from the light source 10 is reflected by the object 2. Then, the reflected light 4 enters the detector 11. The reflected light 4 can be diffused reflection light, specular reflection light or a combination of the above. The reflected light 4 is an example of the reflected wave which is formed by having at least part of the output wave from the light source 10 being reflected by the object 2.

The detector 11 converts the detected light to electric signals. Examples of the detector 11 include photodectors such as photodiodes and photomultiplier tubes. However, as long as detection of light (electromagnetic waves) is possible, any type of element can be used. If the distance between the object 2 and the detector 11 is long, avalanche photo diodes (APDs) operating in Geiger mode can be used. Thereby, the sensitivity of detection can be improved. The detector 11 can convert electromagnetic waves within the detectable frequency band to electric signals. Thus, the detector 11 can detect electromagnetic waves including the reflected waves of the pulses. Also, the detector 11 converts the detected electromagnetic waves to the first electric signal.

The detector 11 detects the ambient light 5 which exists in the environment, besides the reflected light 4 which is emitted light 3 reflected by the object 2. The amount and nature of detected ambient light 5 depends on the design of the electronic apparatus 1 and the environment of the object 2. It is possible that lights from light sources other than the light source 10 (for example, other lighting equipment or sunlight) are reflected by the object 2 and detected by the detector 11. Since such light do not originate from the light source 10, they fall into the category of the ambient light 5.

The A/D converter 12 converts the analog signal provided from the detector 11 to digital signals. The type of circuit used for the A/D converter 12 is not limited.

The equalizer 14 equalizes the digital signals provided from the A/D converter 12. Details of the equalization process executed by the equalizer 14 are described later. By equalizing the first electric signal, the equalizer 14 generates the second electric signal. The equalizer 14 provides the second electric signal (the equalized digital signal) to the computation circuit 15. The computation circuit 15 estimates the distance between the electronic apparatus 1 and the object 2 based on the second electric signal (the equalized digital signal). The Time of Flight (ToF) method can be used to estimate the distance between the electronic apparatus 1 and the object 2.

ToF is the time required for the emitted light 3 to proceed from the light source 10 to the object 2 and to return back to the electronic device 1 due to reflection by the object 2 (reflected light 4). By multiplying the speed of light (approximately $3\times10^8$ m/s) to the time difference ToF and dividing by 2, it is possible to calculate the distance to the object 2. The equation (1) below is the calculated distance.

$$d = \frac{ToF \cdot c}{2} \quad (1)$$

In the equation (1), division by 2 is required to calculate the one-way time instead of the round-trip time.

Figure 2:
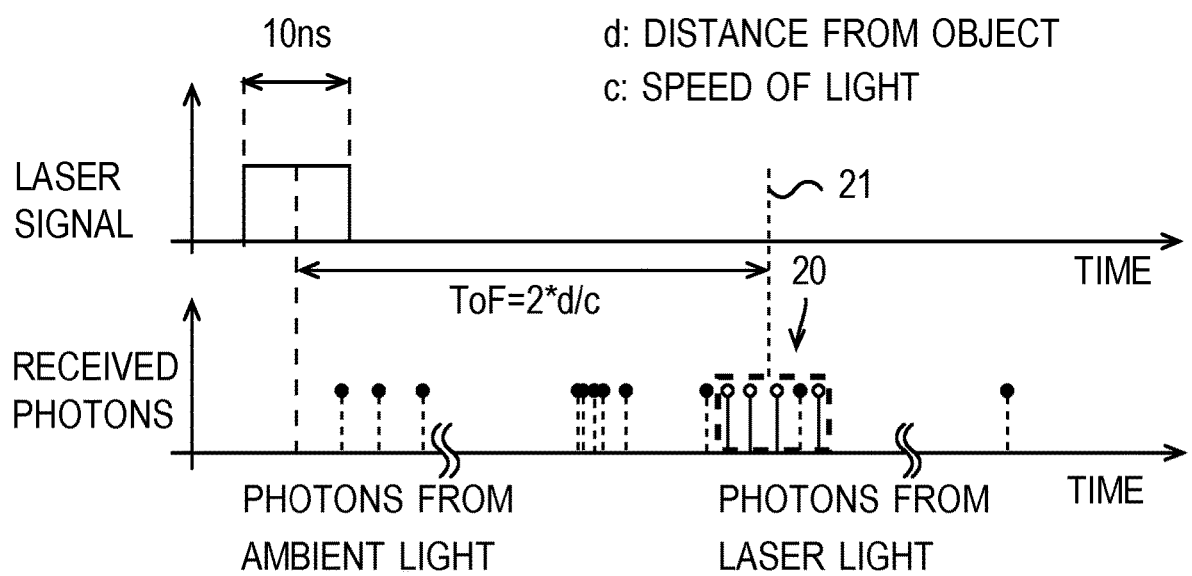
FIG. 2 is a diagram which describes operation of a ToF type LiDAR.

FIG. 2 is a diagram which describes operation of a ToF type LiDAR. The time-chart in the upper side of FIG. 2 describes the pulse emitted by the light source 10. In the example of FIG. 2, a laser light source is used as the light source 10. The time-chart in the bottom side of FIG. 2 describes the photons detected by the detector 11. The horizontal axis in each of the time-charts indicates the time.

The time-chart in the upper side of FIG. 2 includes an approximately rectangular shaped pulse with a width of 10 nanoseconds. In the time-chart in the bottom side of FIG. 2, each photon originating from the ambient light is described by a symbol which is a combination of a broken line and a black circle. Each photon originating from the laser light source is described by a symbol which is a combination of a continuous line and a white circle. The time period 20 when the detection of photons originating from the laser light source are concentrating corresponds to the time period when the photons of the pulse described in the time-chart in the upper side of FIG. 2 arrived to the detector 11. For example, by substituting the time difference between the central time 21 of the time period 20 and the central time of the pulse described in the time-chart in the upper side of FIG. 2, to the aforementioned equation (1), the distance between the electronic apparatus 1 and the object 2 can be estimated.

The aforementioned method which uses the time difference between the central time of the emitted pulse and the central time 21 of the time period 20 is only an example. For example, the time difference between the rising time of the emitted pulse and the starting time of the time period 20 can be used. Thus, the selection of the time used for the estimation is not limited. Also, in the example of FIG. 2, photons which originate from the laser light source and photons which originate from the ambient light 5 were described by using different symbols. However, the detector 11 can detect photons regardless of their origins as long as the photons belong to the detectable frequency band.

Figure 3:
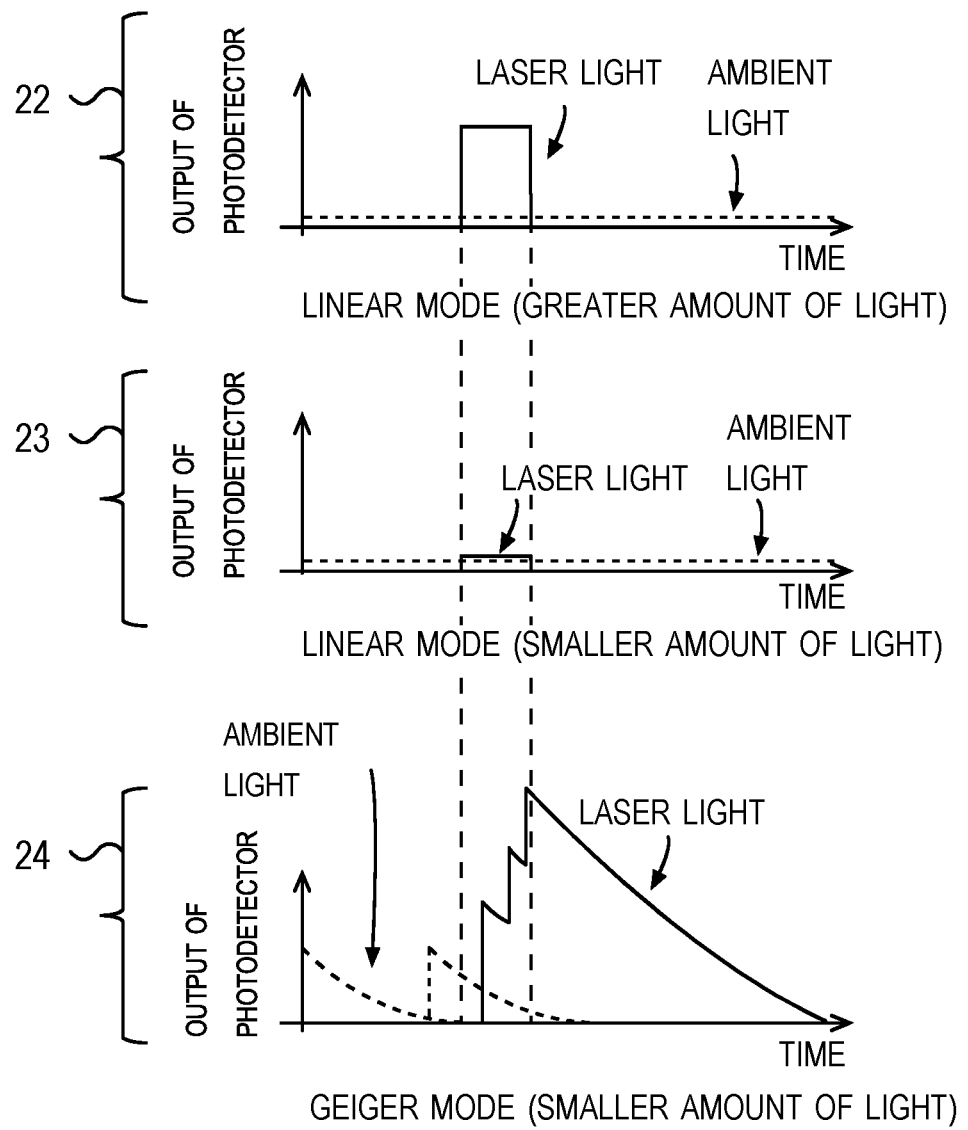
FIG. 3 is a diagram describing the waveforms detected in each operation mode of the detector.

FIG. 3 is a diagram describing the waveforms detected in each operation mode of the detector. The graph 22 in the upper side of FIG. 3 describes the waveform detected when the detector 11 operates in linear mode and the amount of light received is relatively large. The graph 23 in the middle of FIG. 3 describes the waveform detected when the detector 11 operates in linear mode and the amount of light received is relatively small. The graph 24 in the bottom side of FIG. 3 describes the waveform detected when the detector 11 operates in Geiger mode and the amount of light received is relatively small. The detector 11 used in the example of FIG. 3 is an APD.

If the intensity of the detected laser light is large (graph 22), the waveforms in the output signal of the APD operating in linear mode are approximately rectangular shaped (continuous line) which is similar to the pulse shape of the emitted laser light. Thus, it is relatively easy to distinguish the signals which correspond to the laser light (continuous line) from the signals which correspond to the ambient light (broken line) by referring to the waveforms of the output signal.

However, if the intensity of the detected laser light is small (graph 23) and APD operating in linear mode is used, the amplitude level of the waveform corresponding to the laser light (continuous line) and the amplitude level of the waveform corresponding to the ambient light (broken line) becomes approximately equal. Thus, it becomes difficult to distinguish the signals which correspond to the laser light (continuous line) from the signals which correspond to the ambient light (broken line) by referring to the waveforms of the output signal.

If laser light with the same intensity and the same pulse shape are emitted in graphs 22 and 23, graph 22 corresponds to the case when the distance of an object which is relatively close to the electronic apparatus 1 is measured. The graph 23 corresponds to the case when the distance of an object which is relatively far from the electronic apparatus 1 is measured. Here, if the distance between the object and the electronic apparatus 1 is equal to or greater than 200 meters, it could be said that the distance is relatively far.

Thus, APDs operating in linear mode can be used for distance measurements if the intensity of detected light is sufficiently large. However, if APDs operating in linear mode are used for measuring long distances, the intensity of detected light becomes small. Therefore, the distinction between the laser light and the ambient light may become difficult for some cases. Generally, the intensity of laser light required to distinguish the laser light from the ambient light depends on the amount of ambient light.

As mentioned above, if APDs operating in Geiger mode are used, detection of each photon in the light is possible. However, as illustrated in graph 24, transient responses occur when each photon is detected. Thus, when a photon is detected, a waveform which slopes gently from the peak is generated. This waveform which slopes gently from the peak is generated regardless of the origin of the photon. Therefore, this waveform is generated when a photon originating from ambient light is detected (waveform in broken line) and when a photon originating from laser light is detected (waveform in continuous line). Then, there would be overlaps between the waveform corresponding to the ambient light and the waveform corresponding to laser light. Thus, if APDs operating in Geiger mode is used, it becomes difficult to determine the origin of the photons simply by referring to the waveforms.

If distance is measured by using APDs operating in linear mode, various noises affect the accuracy of measurement. However, if distance is measured by using APDs operating in Geiger mode, the accuracy of measurement is also affected by ambient light 5, if the reflected light 4 is used for measurement. In the following, an equalizer which enables accurate measurements of distance by reducing the impact of ambient light 5 is described.

Figure 4:
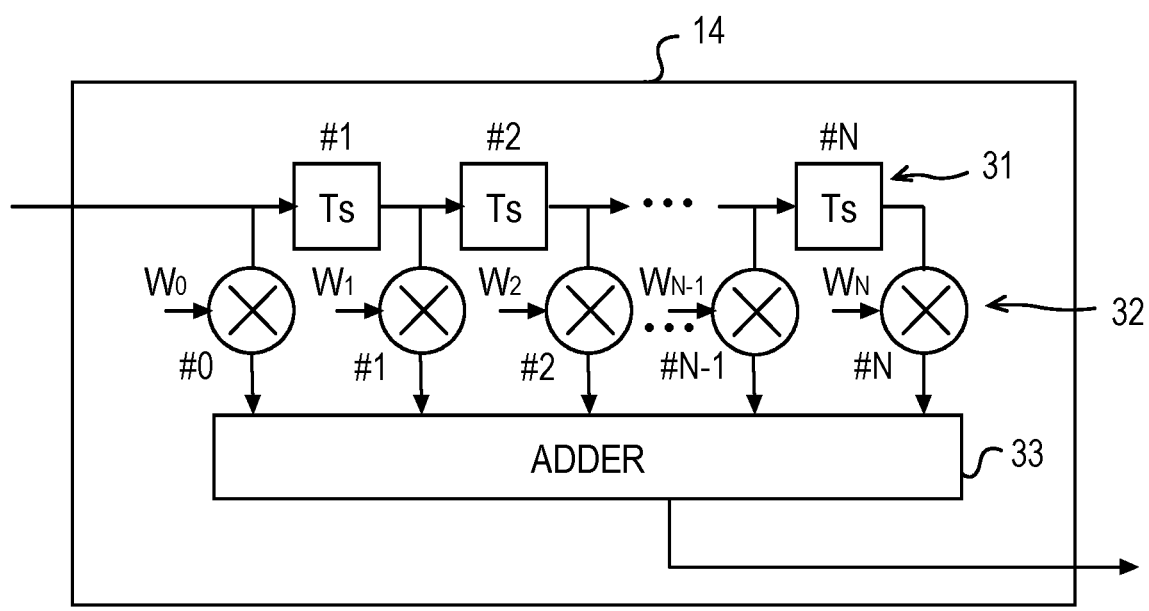
FIG. 4 is a block diagram describing a configuration example of an equalizer according to the first embodiment.

FIG. 4 is a block diagram describing a configuration example of an equalizer according to the first embodiment. The equalizer 14 in FIG. 4 includes N delaying elements 31 and N+1 mutipliers 32 and an adder 33. From the left side to the right side of FIG. 4, numbers #1, #2, # N are assigned to each of the N delaying elements. Also, from the left side to the right side of FIG. 4, numbers #0, #1, # N are assigned to the N+1 mutipliers 32.

Each of the delaying elements 31 provides an output signal with a delay from the input signal. For example, the delaying element 31 can be implemented by using flip-flops. The multiplier 32 provides an output signal which is generated by multiplying the input signal with the tap coefficient corresponding to the assigned number. For example, the multiplier #0 generates an output signal by multiplying the input signal by the tap coefficient $w_0$. The multiplier 41 generates an output signal by multiplying the input signal by the tap coefficient $w_1$. The multiplier #2 generates an output signal by multiplying the input signal by the tap coefficient $w_2$. The multiplier # N−1 generates an output signal by multiplying the input signal by the tap coefficient $w_{N-1}$. The multiplier # N generates an output signal by multiplying the input signal by the tap coefficient $w_N$.

The adder 33 adds the output signals from the plurality of multipliers 32 (multipliers #0 to # N). Then, the adder 33 provides the added signal as the output signal. The output signal of the adder 33 corresponds to the equalized signal. (Calculation in the Time Domain)

Next, the calculation of the tap coefficients $w_0$ to $w_N$ is described. Here, a case when calculation in the time domain is executed is explained. First, the vector of equation (2) is generated by sampling the input signal of the equalizer (the signal entered to the delaying element #1) and the output signals of the delaying elements #1 to # N.

$$x=[x_0, x_1, \ldots, x_N]^T \quad (2)$$

Here, $x_1$ is the input signal of the equalizer (the signal entered to the delaying element #1). Also, $x_1$ to $x_N$ correspond to the output signals of the delaying elements #1 to # N.

Each element of the vector in equation (3) corresponds to the tap coefficients used in the equalizer.

$$w=[w_0, w_1, \ldots, w_N]^T \quad (3)$$

The product of the vector in equation (2) and the vector in equation (3) becomes the output y of the equalizer. The following equation (4) is the output y of the equalizer.

$$y=w^T x \quad (4)$$

The electronic apparatus 1 according to the embodiment can determine the tap coefficients ensuring that the average minimum mean square error between the output value of the equalizer y and the output value of the pulse emitted by the light source m is minimized. Tap coefficients calculated by using the above method correspond to the optimum weight. The units used for expressing the output value of the equalizer y and the output value of the pulse emitted by the light source m are not limited. Examples of the units include the current, the voltage and the electrical power. However, any other unit can be used to measure the signal. Also, the output value of the equalizer y and the output value of the pulse emitted by the light source m can be normalized values.

To calculate the optimum weight, the evaluation function J of the following equation (5) can be used.

$$J=E[|m-y|^2]=E[|m^2|]-w^T r_{xd}*-w^H r_{xd}+w^H R_{xx}w \quad (5)$$

Here, the function E[ . . . ] represents the ensemble average. The symbol T suffixed to the vector w represents a transposed matrix. The symbol H suffixed to the vector w represents a conjugate transposed (Hermitian transposed) matrix. The vectors used in the equation (5) are defined according to the equation (6) below.

$$R_{xx}=E[x*x^T]$$

$$r_{xd}=E[x*m] \quad (6)$$

By obtaining the output value of the equalizer y and the output value of the pulse emitted by the light source m for a plurality of trials, the ensemble averages in the equations (5) and (6) can be calculated. The error between the output value of the equalizer y and the output value of the pulse emitted by the light source m can be minimized if the value of the evaluation function J is minimized. The value of the evaluation function J is minimized if the condition of equation (7) is satisfied.

$$\frac{\partial J}{\partial w} = 0 \tag{7}$$

If the optimum weight is calculated by using the equation (7), the following equation (8) can be obtained.

$$w_{opt} = R_{xx}^{-1} r_{xd} \tag{8}$$

Each element in the vector of equation (8) can be used as the tap coefficients $w_0$ to $w_N$ of the equalizer 14. Therefore, if calculation in the time domain is executed, the tap coefficients of the equalizer 14 is determined to ensure that the ensemble average of squared value of difference between the output value of the equalizer y and the output value of the pulse emitted by the light source m is minimized.

The equalizer 14 can be a Zero-Forcing (ZF) equalizer or a Minimum Mean Square Error (MMSE) equalizer. If a Zero-Forcing equalizer is used, the vector of equation (2) which is sampled corresponds to the response characteristics of the detector 11 when a photon was detected. In this case, the shape of the waveform after equalization can match with the pulse shape of the light source 10. However, there is a risk that the noise components generated in the detector 11 is amplified.

If a Minimum Mean Square Error (MMSE) equalizer is used, the vector of equation (2) corresponds to the waveform including both the response characteristics of the detector 11 when a photon was detected and the noise components generated in the detector 11. In this case, the waveform after equalization does not completely match with the pulse shape of the light source 10. However, by using the MMSE equalizer, the risk of having the noise components generated in the detector 11 being amplified can be reduced. However, equalizers other than the Zero-Forcing equalizer and the MMSE equalizer can be used as the equalizer 14. Thus, the type of equalizer used in the electronic apparatus 1 is not limited.

(Calculation in Frequency Domain)

Next, the calculation of the tap coefficients $w_0$ to $w_N$ in the frequency domain is described. The tap coefficients of the equalizer 14 can be calculated by the aforementioned calculation in the time domain. Also, the tap coefficients of the equalizer 14 can be determined by executing calculation in the frequency domain which is described below.

Figure 5:
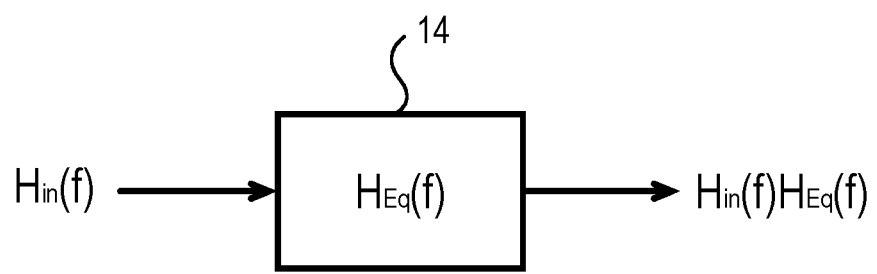
FIG. 5 is a diagram describing the frequency responses of input and output signals of the equalizer.

FIG. 5 is a diagram describing the frequency responses of input and output signals of the equalizer. As presented in FIG. 5, the frequency response of the signal after equalization $H_d(f)$ can be expressed according to the equation (9) below.

$$H_{in}(f) \cdot H_{Eq}(f) = H_d(f) \tag{9}$$

Here, $H_{in}(f)$ is the frequency response of the input signal of the equalizer 14. Also, $H_{Eq}(f)$ is the frequency response of the equalizer 14.

In the following, a case when equalization is executed ensuring that the input signal is converted to a signal with the desired frequency responses is described. If the signal needs to be converted to a signal with the frequency response $H_d(f)$, an equalizer 14 satisfying the following equation (10) can be used.

$$H_{Eq}(f) = \frac{H_d(f)}{H_{in}(f)} \tag{10}$$

For example, suppose that the desired frequency response $H_d(f)$ is the frequency response of the pulse emitted by the light source $H_{LD}(f)$. For example, the frequency response of the pulse emitted by the light source $H_{LD}(f)$ can be calculated by the Fourier conversion of the time-domain waveform of the light emitted by the light source 10. The algorithm used for Fourier conversion is not limited. As described in FIG. 1, the output signal of the detector 11 is entered to the equalizer 14 after A/D conversion. Therefore, the frequency response of the detector 11 $H_{PD}(f)$ can be used as the frequency response of the input signal of the equalizer 14. By using the above relation, the equation (10) for the frequency response of the equalizer $H_{Eq}(f)$ can be expressed according to the following equation (11).

$$H_{Eq}(f) = \frac{H_{LD}(f)}{H_{PD}(f)} \tag{11}$$

Based on needs, the frequency response of the pulse emitted by the light source $H_{LD}(f)$ is called the first frequency response. The frequency response of the detector 11 $H_{PD}(f)$ is called the second frequency response. The frequency response obtained by dividing the first frequency response with the second frequency response is called the third frequency response. The third frequency response corresponds to $H_{EQ}(f)$ in equation (11).

If calculation in the frequency domain is executed, the impulse response is obtained by calculating the inverse Fourier transformation of the frequency response of the equalizer 14, In the following, details of the calculation in the frequency domain are explained.

If the light source 10 generates a pulse which is approximately rectangular shaped, the waveform of the light source 10 including the pulse can be described according to the following equation (12).

$$h_{LD}(t) = \begin{cases} 1, & 0 \le t \le T_{LDPW} \\ 0, & \text{otherwise} \end{cases} \tag{12}$$

Here, $T_{LDPW}$ indicates the pulse width of the light source. If the Fourier transformation of the waveform of equation (12) is calculated, it can be used as the frequency response of the pulse emitted by the light source 10 $H_{LD}(f)$.

Also, the response waveform (time domain waveform) $h_{PD}(t)$ generated when the detector 11 detects a photon can be modeled by using an exponential decay function with time constant t, according to the following equation (13).

$$h_{PD}(t) = \begin{cases} 0, & t < 0 \\ \exp\left(-\frac{t}{\tau}\right), & t \ge 0 \end{cases} \tag{13}$$

If the Fourier transformation of the time domain waveform of equation (13) is calculated, it can be used as the frequency response of the detector 11 $H_{PD}(f)$.

The time domain waveforms of equations (12) and (13) are only examples. Therefore, different waveforms can be used. For example, if the pulse shape of the light source 10 is not approximately rectangular shaped, an equation different from equation (12) can be used. Also, the response waveform when the detector 11 detected a photon can be modeled by using an equation different from equation (13).

Figure 6:
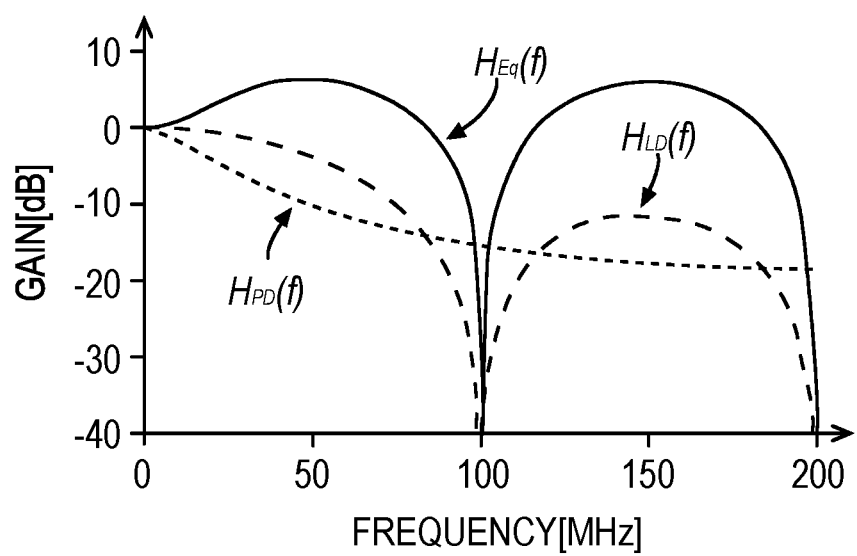
FIG. 6 is a diagram describing relationships between the frequency responses of the light source/detector and frequency response of the equalizer.

FIG. 6 is a diagram describing relationships between the frequency responses of the light source/detector and frequency response of the equalizer. The vertical axis of the graph in FIG. 6 is the gain in units of decibels. Also, the horizontal axis of the graph in FIG. 6 is the frequency in units of MHz. In the graph of FIG. 6, the frequency response $H_{LD}(f)$ of the pulse emitted by the light source 10 and the frequency response $H_{PD}(f)$ of the detector 11 are described by using broken lines. Also, the frequency response of the equalizer 14 is described by using a continuous line. Here, the frequency response $H_{EQ}(f)$ of the equalizer 14 is calculated by using equation (11). The graph presented in the example of FIG. 6 corresponds to the case when the pulse width of the light source 10 $T_{LDPW}$ and the time constant of equation (13) are both 10 nanoseconds.

Figure 7:
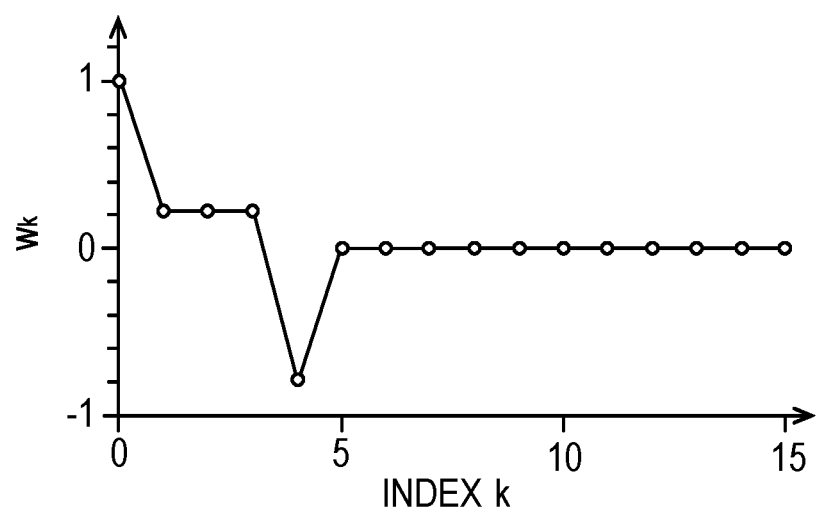
FIG. 7 is a diagram describing an example of an impulse response of the equalizer.

Next, the inverse Fourier transformation is calculated for the frequency response $H_{Eq}(f)$ of the equalizer 14. The frequency response $H_{EQ}(f)$ of the equalizer 14 is calculated by using equation (11) described above. Thereby, the impulse response of the equalizer 14 (for example, the graph of FIG. 7) can be obtained. FIG. 7 represents the result when the sampling frequency is set to 400 MHz and inverse Fourier transformation is executed. The calculated impulse responses are used as the tap coefficients $w_k$ (k=0, 1, ..., N) of the equalizer 14. In the graph of FIG. 7, the vertical axis indicates the value of the tap coefficients $w_k$. The horizontal axis of the graph in FIG. 7 indicates the index k of the each tap coefficient.

Figure 8:
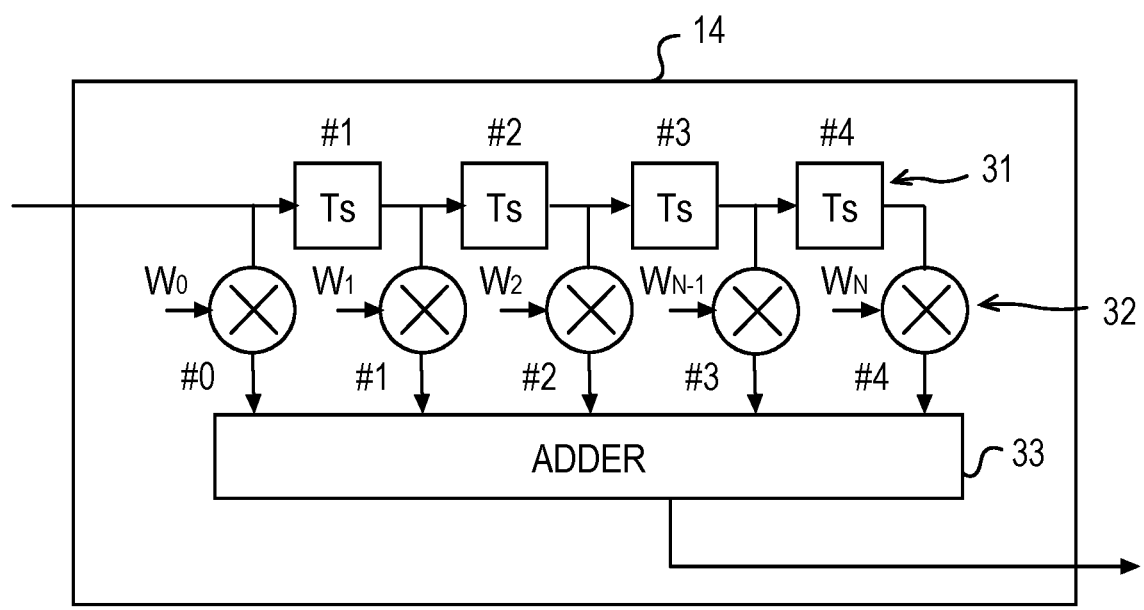
FIG. 8 is a block diagram describing a configuration example of the equalizer with four delaying elements.

Referring to the graph of FIG. 7, if the index k is equal to or greater than 5, the value of the impulse response is 0. Thus, an equalizer with four delay elements 31 (delay elements #1 to #4) can be used, as presented in FIG. 8.

Figure 9:
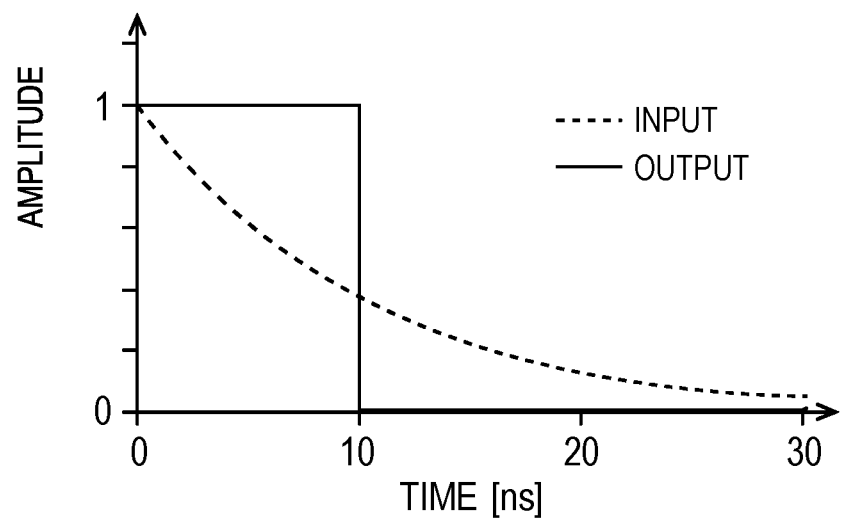
FIG. 9 is a diagram describing an example of the waveform of the input signal and output signal of the equalizer.

FIG. 9 is a diagram describing an example of the waveform of the input signal and output signal of the equalizer 14. The vertical axis of the graph in FIG. 9 indicates the amplitude of the waveforms. Also, the horizontal axis of the graph in FIG. 9 indicates the time. In the graph of FIG. 9, the waveform entered to the equalizer 14 is described by using a broken line. The waveform entered to the equalizer 14 corresponds to the response waveform of the detector 11 when a photon is detected. Also, in the graph of FIG. 9, the waveform in the output signal of the equalizer 14 is described by using continuous lines. Referring to the graph of FIG. 9, it can be inferred that the response waveform when a single photon is detected is equalized to the pulse shape of the light emitted by the light source 10. Here, the pulse shape of the light emitted by the light source 10 is approximately rectangular shaped with a pulse width of 10 nanoseconds.

As mentioned above, the tap coefficients of the equalizer 14 can be determined based on both the output value of the equalizer 14 and the output value of the pulse generated in the light source 10. Also, the tap coefficients of the equalizer 14 can be determined based on the difference between the output value of the equalizer 14 and the output value of the pulse generated in the light source 10. The tap coefficients of the equalizer 14 can be determined ensuring that the difference between the output value of the equalizer 14 and the output value of the pulse generated in the light source 10 is minimized. Thus, the tap coefficients of the equalizer 14 can be determined based on the waveform of the pulse generated in the light source 10 and the waveform of the output signal of the detector 11. The aforementioned calculation in the time domain is an example of methods which can be used to determine the tap coefficients.

It can be said that the tap coefficients of the equalizer are determined to ensure that the waveform in the output signal of the detector 11 is shaped to the waveform of the pulse generated in the light source 10. As described in the aforementioned calculation in the frequency domain, the tap coefficients of the equalizer can be determined based on the first frequency response of the pulse generated in the light source 10 and the second frequency response of the detector 11.

Figure 10:
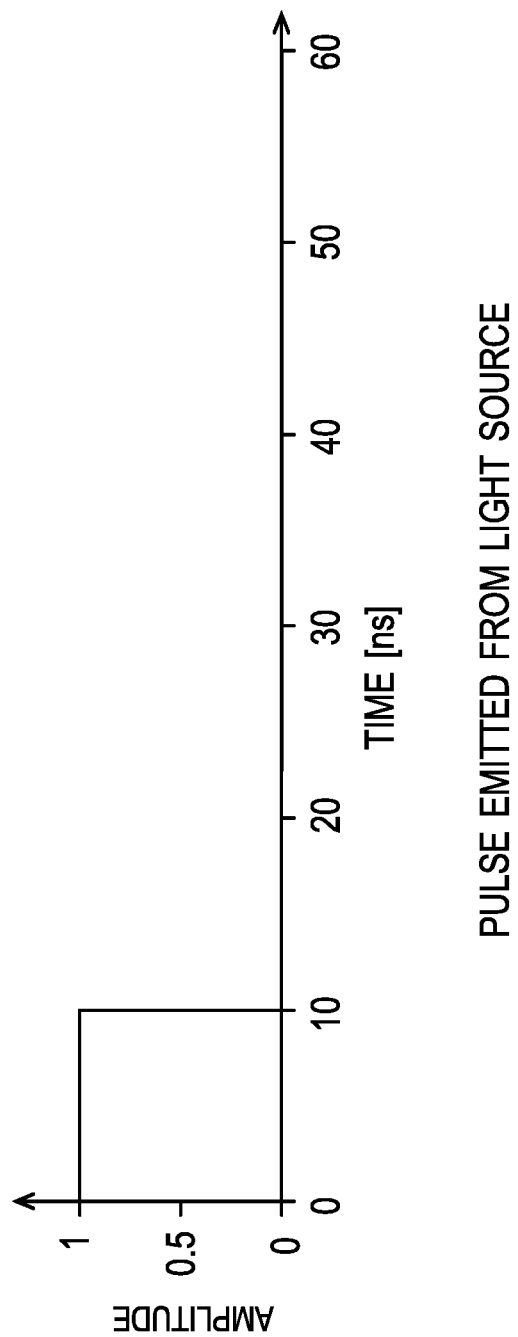
FIG. 10 is a diagram describing an example of an approximately rectangular shaped pulse generated by the light source.
Figure 11:
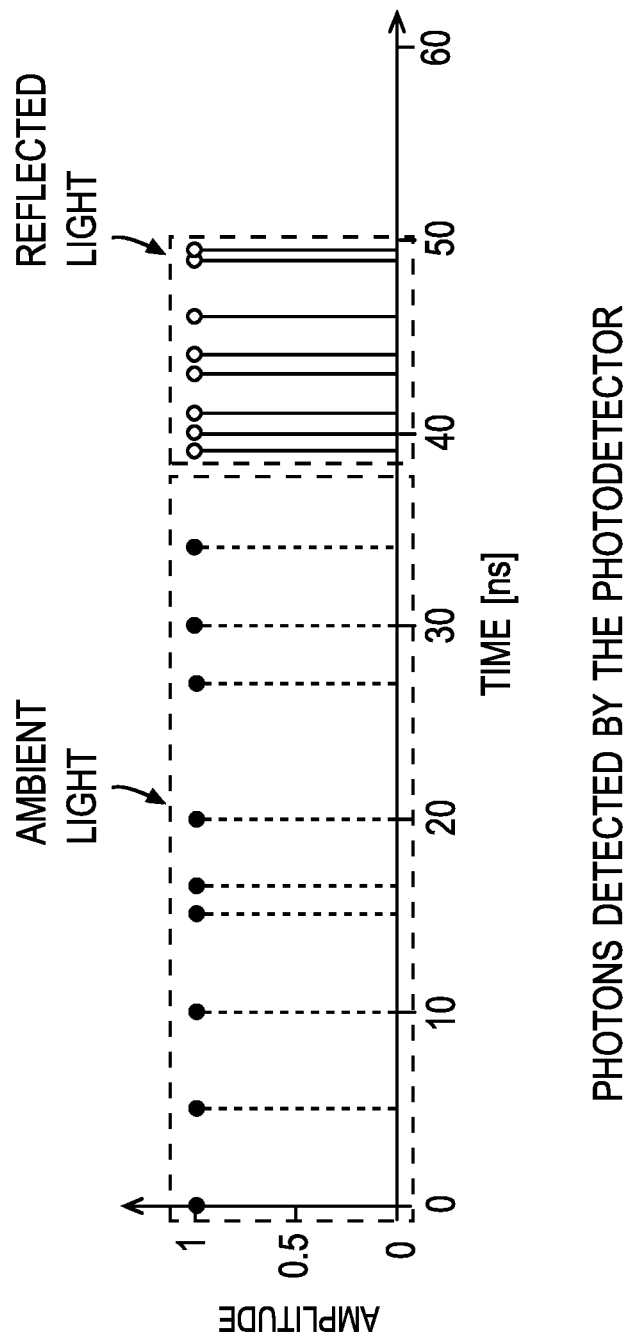
FIG. 11 is a diagram describing a detection example of a photon by the detector.
Figure 12:
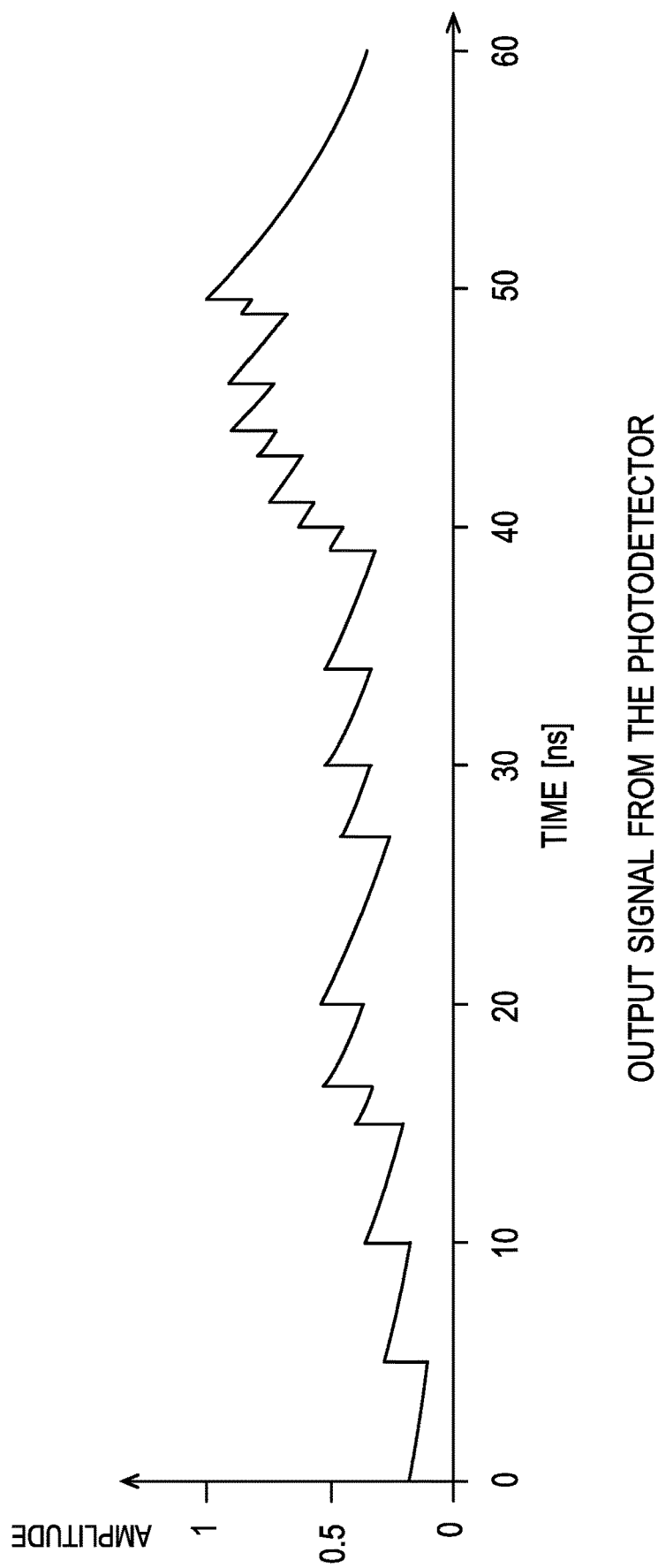
FIG. 12 is a diagram describing an example of the waveform in the output signal of the detector, when a photon was detected.
Figure 13:
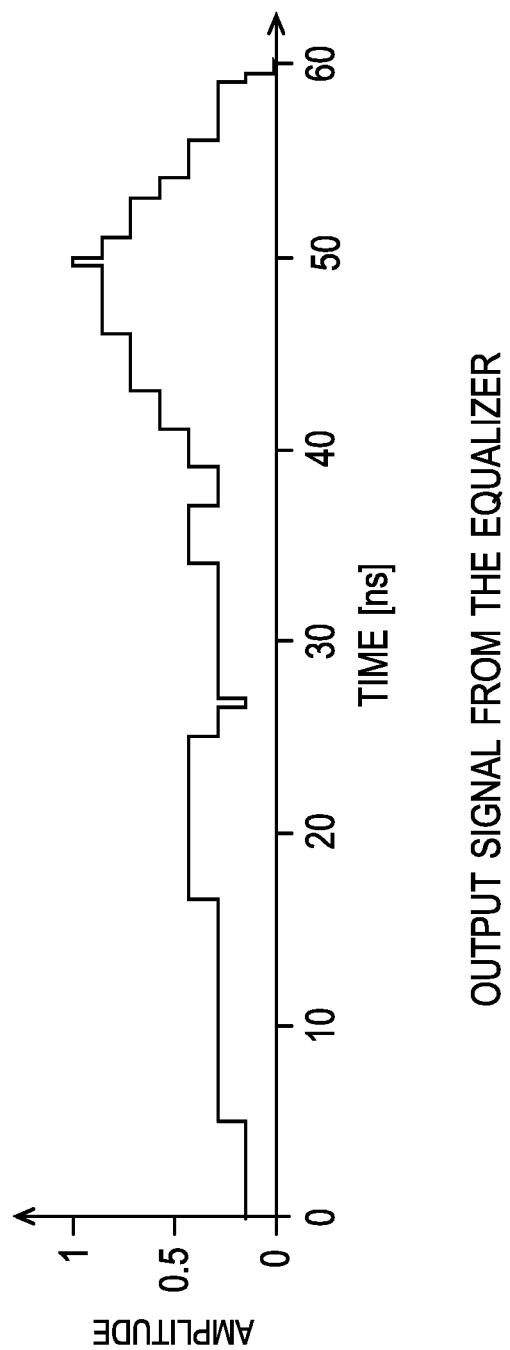
FIG. 13 is a diagram describing an example of the waveform in the output signal of the equalizer.

Next, the time domain waveforms of the signals in each processing step of the electronic apparatus 1 are described. FIG. 10 is a diagram describing an example of an approximately rectangular shaped pulse generated by the light source 10. FIG. 11 is a diagram describing a detection example of a photon by the detector 11. FIG. 12 is a diagram describing an example of the waveform in the output signal of the detector 11, when a photon was detected. FIG. 13 is a diagram describing an example of the waveform in the output signal of the equalizer 14, For each of the graphs in FIG. 10 to FIG. 13, the vertical axis indicates the amplitude of the time domain waveform. The amplitudes are normalized to ensure that the maximum value equals to 1. Also, for each of the graphs, the horizontal axis indicates the time in units of nanoseconds. The time when light (emitted light 3) is emitted from the light source 10 corresponds to 0 nanoseconds.

In FIG. 10, a waveform with an approximately rectangular shaped pulse with width of 10 nanoseconds is presented as an example of the waveform in the emitted light 3 of the light source 10. The pulse of light presented in FIG. 10 is reflected by the object 2. Part of the reflected light returns to the detector 11 of the electronic apparatus 1 (FIG. 11). Generally, part of the light which is reflected by the object 2 becomes diffused reflection light. Also, part of the light which is reflected by the object 2 becomes specular reflection light. Also, part of the light is absorbed by the object 2. Depending on the physical characteristics of the object 2 and the frequency of light, part of the light may penetrate through the object 2. Thus, the light which is detected by the detector 11, as presented in FIG. 11 is part of the light which is emitted by the light source 10.

In FIG. 11, each photon corresponding to the ambient light 5 is presented by a symbol which is a combination of a black circle and a broken line. Also, each photon corresponding to reflected light 4 is presented by a symbol which is a combination of a white circle and a continuous line. In the example of FIG. 11 photons originating from reflected light 4 are detected between time of 39 nanoseconds and 49 nanoseconds. However, photons originating from ambient light 5 are detected spontaneously in different timings. The effect of photons originating from ambient light 5 should be reduced in order to improve the accuracy of distance measurements.

The response waveform corresponding to each photon in the detector 11 (FIG. 12) are exponential decay functions with the time constant of 10 nanoseconds. Due to the occurrence of transient responses, the response waveforms corresponding to each photon are overlapping in the output signal of detector 11.

FIG. 13 is an example of the time domain waveform after equalization of signal by the equalizer 14. The computation circuit 15 measures the distance between the electronic apparatus 1 and the object 2 based on the time when the peak amplitude for the time domain waveform (for example, FIG. 13) is detected. Therefore, in order to improve the accuracy of measurement by the electronic apparatus 1, ratio between the first peak value and the second peak value can be set to a larger value. Here, the first peak value is the value of peak amplitude in the time period when a relatively large number of photons originating from the reflected light 4 are detected. The second peak value is the value of peak amplitude in the time period when a relatively large number of photons originating from the ambient light 5 are detected.

In the time domain waveform of the signal before equalization (FIG. 12), the value of the first peak and the second peak are 1.0 and 0.55, respectively. In the time domain waveform of the signal after equalization (FIG. 13), the value of the first peak and the second peak are 1.0 and 0.43 respectively. Thus, by having the equalizer 14 equalize the signal, the ratio between the first peak value and the second peak value becomes greater, improving the accuracy of distance measurements.

If a plurality of peaks is detected in the time domain waveform of the output signal from the detector 11, the peak with the greatest amplitude can be selected as the first peak value. This selection of the first peak value can be executed when the light source 10 is a laser light source. Laser light sources generate coherent light with high monochromaticity and high directivity. Generally, the coherence and directivity of ambient light 5 originating from other light sources are not as high as the coherence and directivity of light originating from laser light sources. Therefore, the aforementioned selection of the first peak value enables the detection of the peak amplitude of signals corresponding to the light source 10.

Second Embodiment

The pulse shape, the pulse width, the intensity and the frequency of electromagnetic waves (light) generated by the light source of the electronic apparatus (distance measuring device) does not need to be fixed. For some light sources, the pulse shape, the pulse width, the intensity and the frequency of generated electromagnetic waves are adjustable. If measurements of distances are executed by using such light sources, the electromagnetic wave emitted by the light source can be set to conditions suitable for distance measurement. Also, information on the settings of the electromagnetic waves generated by the light source can be notified to the equalizer. The electronic apparatus according to the second embodiment includes a controller. The controller can change the settings of the electromagnetic waves generated by the light source. Also, the controller can notify the settings of the electromagnetic waves generated by the light source, to the equalizer.

In the following, the electronic apparatus according to the second embodiment is described, focusing on the difference between the electronic apparatus according to the first embodiment.

Figure 14:
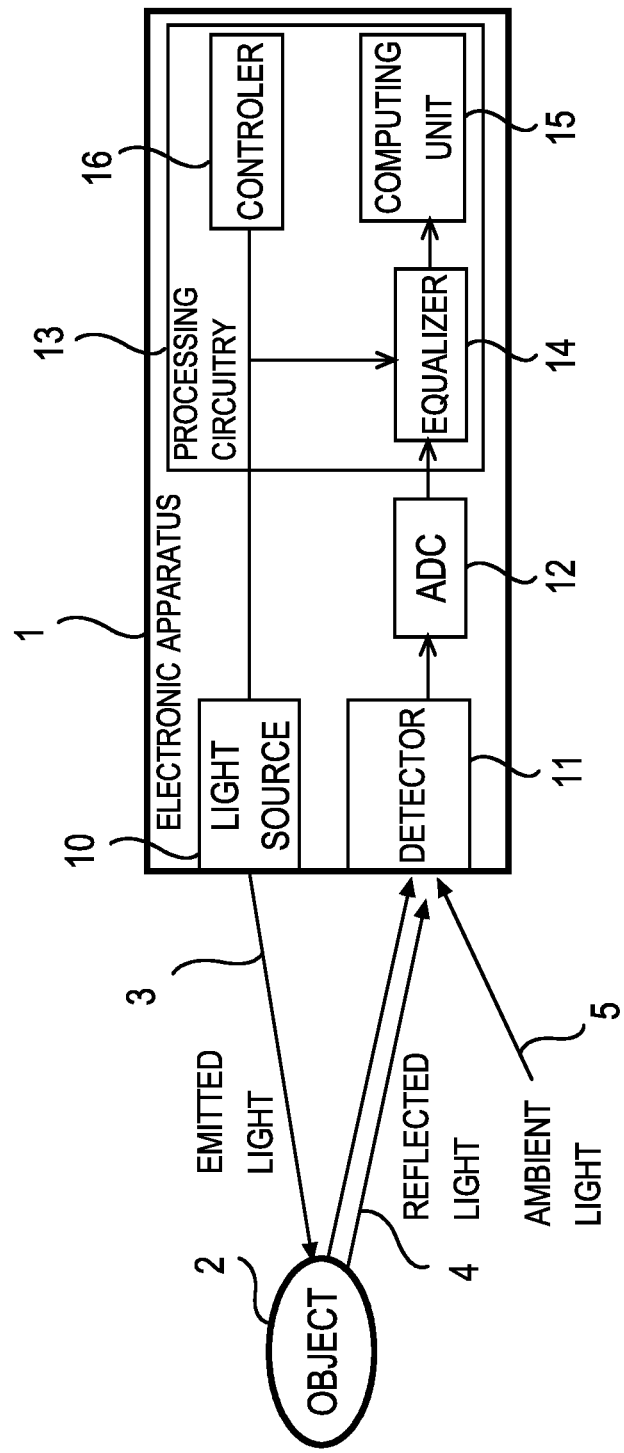
FIG. 14 is a block diagram describing a configuration example of an electronic apparatus according to a second embodiment.

FIG. 14 is a block diagram describing a configuration example of an electronic apparatus according to a second embodiment. The electronic apparatus 1 of FIG. 14 includes a controller 16 as an internal component of the processing circuitry 13. Besides the fact that the electronic apparatus 1 has a controller 16 and the fact that both the light source 10 and the equalizer 14 are controlled by the controller 16, the configuration of the electronic apparatus according to the second embodiment is similar to the electronic apparatus according to the first embodiment.

The controller 16 controls the pulse shape, the pulse width, the intensity and the emission timing of the light generated by the light source 10. Also, the controller 16 can control the frequency of the generated light and the direction the light is emitted. The controller 16 is connected electrically to the light source 10. The controller 16 transmits control signals to the light source 10 to execute the aforementioned controlling process. The controller 16 can use wireless communication to transmit the control signals to the light source 10.

The controller 16 can be connected electrically to the equalizer 14. Then, the controller 16 notifies information on the pulse emitted by the light source 10 (called the pulse information) to the equalizer 14. If calculation in the frequency domain is executed, the pulse information can include data of the time domain waveform of emitted light, the pulse width $T_{LDPW}$ of the light source 10 and the frequency response $H_{LD}(f)$ of the pulse emitted by the light source 10. If calculation in the time domain is executed, the pulse information can include the output value of the light emitted from the light source 10, described in equation (5), The equalizer 14 can determine the tap coefficients $w_k$ (k=0, 1, . . . , N) used for equalization, based on the notified pulse information. Also, the controller 16 can transmit pulse information to the equalizer 14 by using wireless communication.

Similar to the electronic apparatus according to the first embodiment, the emitted light 3 from the light source 10 proceeds to the object 2. Then, part of the reflected light 4 of the object 2 is detected by the detector 11. Also, ambient light 5 which originates from light sources other than the light source 10 is detected by the detector 11.

The detector 11 converts the detected light to electric signals. The electric signal is converted from analog signals to digital signals by the A/D converter (ADC) 12, Then, the digital signal is entered to the equalizer 14. The equalizer 14 equalizes the digital signal based on the pulse information notified from the controller 16. Then, the equalized output signal is entered to the computation circuit 15. The computation circuit 15 estimates the distance between the electronic apparatus and the object 2 based on the equalized signal.

If the controller 16 changes the shape of the pulses generated in the light source 10, the new shape of the pulse is notified to the equalizer 14. Thus, even when there are changes in settings of the light source 10, the equalizer 14 can execute equalization processes adapted to the pulse shape generated in the light source 10. Thus, the accuracy of distance measurements can be improved.

In above, a case when the light source 10 emits light with approximately rectangular shaped pulse with a width of 10 nanoseconds was described as an example. However, the pulse shape generated by the light source 10 can be different. Also, the pulse width can be set to a different value. The pulse shape does not necessary have to be approximately rectangular (rectangular waves).

Figure 15:
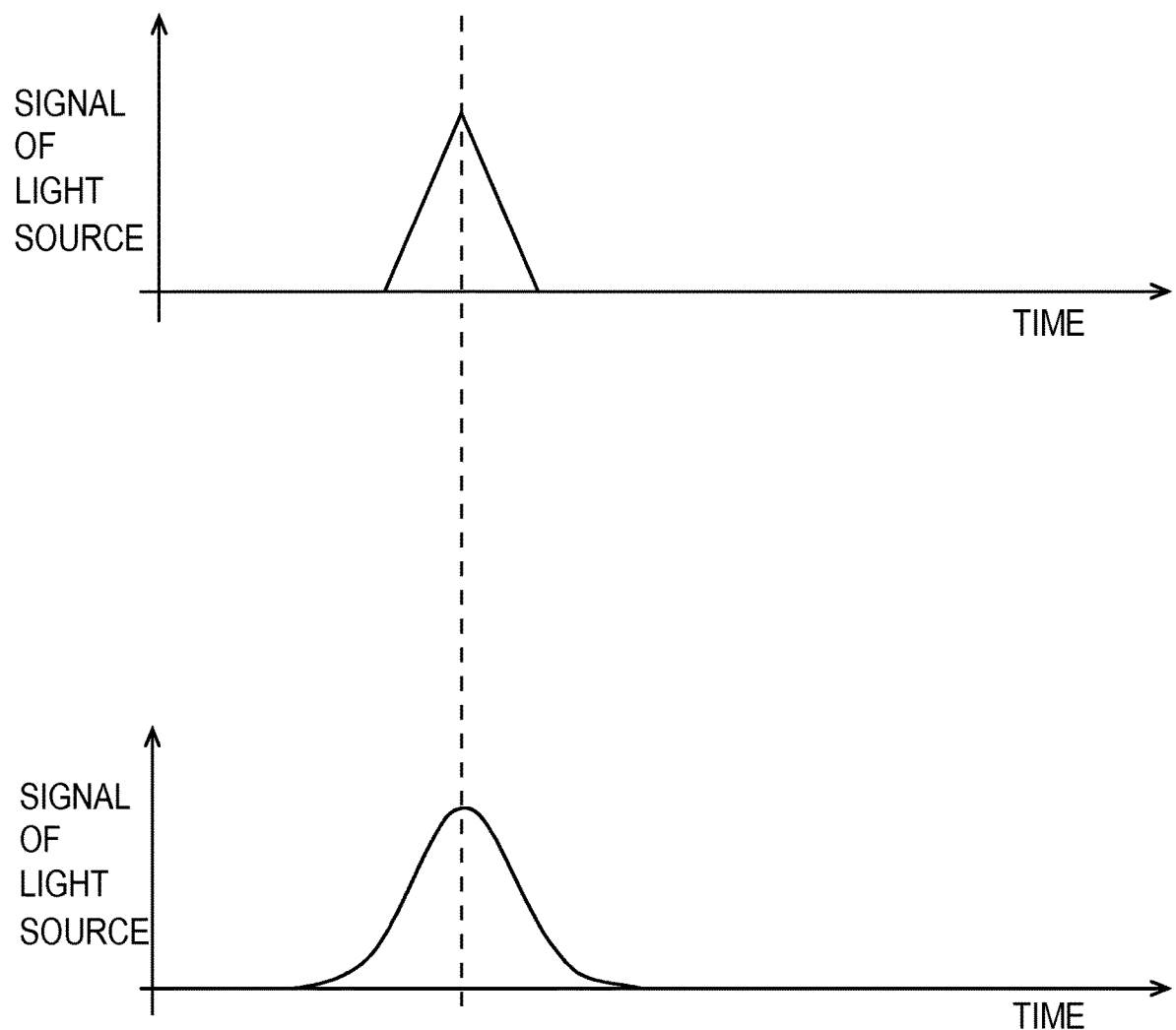
FIG. 15 is a diagram describing an example of pulse shape generated by the light source.

FIG. 15 is a diagram describing an example of pulse shape generated by the light source 10. In each of the graphs in FIG. 15, the vertical axis indicates the amplitude. The horizontal axis indicates the time. As presented in the upper side of FIG. 15, an approximately triangular shaped pulse can be generated by the light source 10. Also, as presented in the bottom side of FIG. 15, an approximately Gaussian curve shaped pulse can be generated by the light source 10. However, the time domain waveforms of FIG. 15 are only examples. Therefore, pulse with different shapes can be generated by the light source 10.

Third Embodiment

Figure 16:
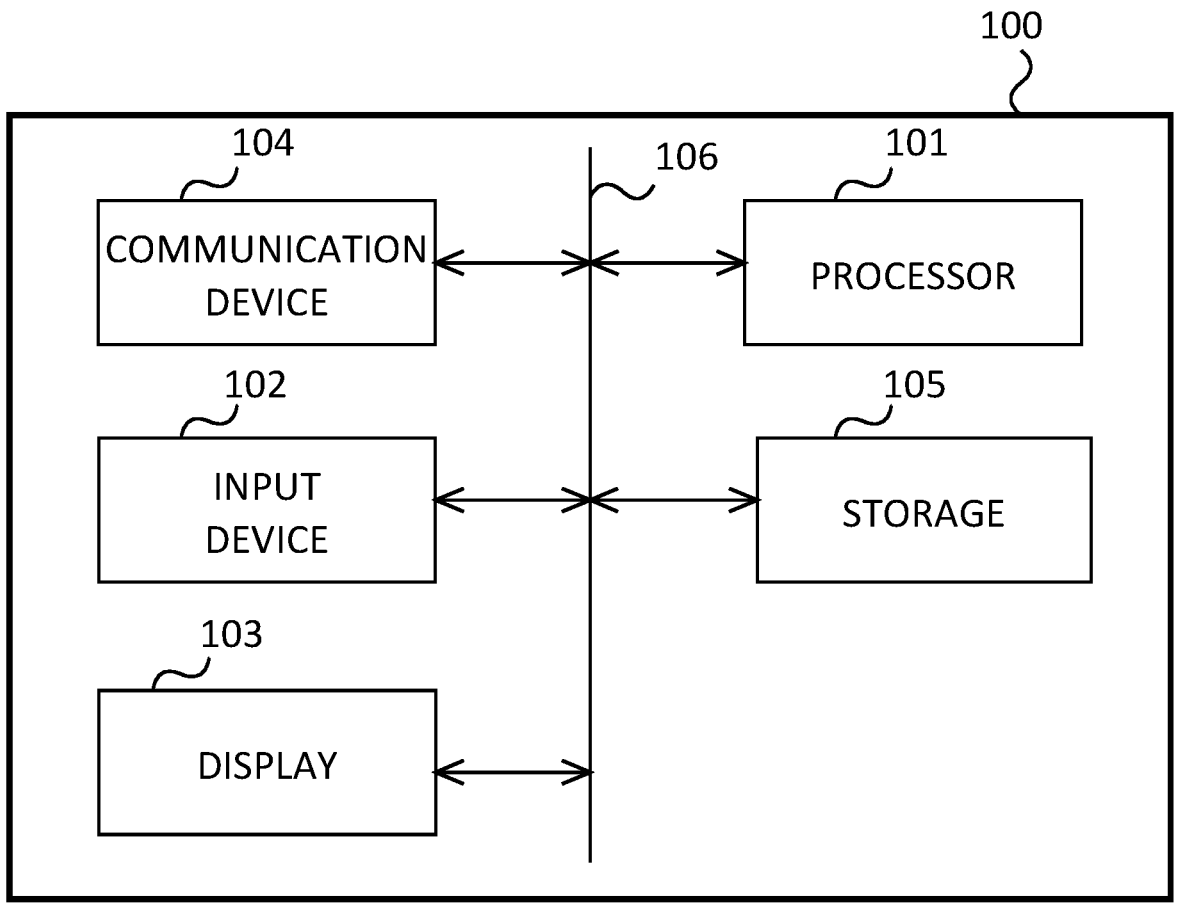
FIG. 16 is a block diagram describing a configuration example of hardware including the processing circuitry.

In the third embodiment, the hardware configuration of the components is described. FIG. 16 is a diagram showing hardware configuration of the electronic apparatus. For example, at least part of the processing circuitry 13 according to the above embodiments and variations can be implemented by using a computer 100. The computer 100 can send instructions to the light source 10 to generate pulses. Also, the computer 100 can obtain results from the computation circuit 15 of the electronic apparatus 1 and display the results on a display 103.

Examples of the computer 100 include various information processing devices including servers, client devices, microprocessors of embedded devices, tablets, smartphones, feature phones and personal computers. The computer 100 may be implemented by VMs (virtual machines) or containers.

The computer 100 in FIG. 16 includes a processor 101, an input device 102, a display 103, a communication device 104 and a storage 105. The processor 101, the input device 102, the display 103, the communication device 104 and the storage 105 are electrically connected to each other via a bus 106.

The processor 101 is an electric circuit including the controller and arithmetic unit of the computer 100. It is possible to use general purpose processors, central processing units (CPUs), microprocessors, digital signal processors, controllers, microcontrollers, state-machines, ASICs, FPGAs, PLDs or a combination of the above as the processor 101.

The processor 101 executes arithmetic operations by using data or programs provided from devices connected via the bus 106 (for example, the input device 102, the communication device 104 and the storage 105). Also, the processor 101 transmits the calculated results and control signals to the devices connected via the bus 106 (for example, the display 103, the communication device 104 and the storage 105). Specifically, the processor 101 executes the OS (the operation system) of the computer 100 and control programs. Also, the processor 101 controls various devices which are included in the computer 100. The processor 101 may control devices which are communicating with the computer 100.

By using the control program, it is possible to make the computer 100 operate as the aforementioned electronic apparatus 1. Examples of processes executed by the control program include sending instructions to the pulse generator circuit of the light source 10, equalization of electric signals, notifying the settings of the emitted electromagnetic waves to the detector 11 or the equalizer 14, calculations of distances in the computation circuit 15 and calculations of distance based on the equalized signals the computation circuit 15. At least part of the processes above can be executed by hardware circuits, instead of the control program.

The control program is stored in a non-transitory storage medium which is readable by the computer. Examples of the storage medium include optical discs, magnetic discs, magnetic tapes, flash memories and semiconductor memory. However, the type of storage medium is not limited. When the processor 101 executes the control program, the computer 100 operates as the electronic apparatus 1.

The input device 102 is a device for entering information to the computer 100. Examples of the input device 102 include a keyboard, a mouse and a touch panel. However, the type of device is not limited. By using the input device 102, the user can enter the pulse shapes of the emitted electromagnetic wave, pulse width of the emitted electromagnetic wave, intensity of the emitted electromagnetic wave, the timing when the pulse of the electromagnetic wave is emitted, the frequency of the electromagnetic wave, methods used for equalizations and instructions to start measurement of distances and instructions to change the contents displayed on the display 103, to the computer 100.

The display 103 can display texts, graphics and videos. Examples of the display 103 include a LCD (liquid crystal display), CRT (cathode ray tube) or an organic electroluminescence display. However, the type of displays used is not limited. If the computer 100 is used as a distance measuring device information including the shape of the pulses, width of the pulses, intensity of the pulses, timing for emitting pulses, the frequency (pulse information) and the distance to the object 2 can be presented on the display 103.

The communication device 104 enables the computer 100 to communicate with external devices via wireless or wired communication mediums. Examples of the communication device 104 include Network Interface Cards, communication modules, hubs and routers. However, the type of device is not limited. Also, if the computer 100 is a server installed in data centers and machine rooms, the computer 100 may accept instructions transmitted from remote communication terminals and transmit contents to be displayed in remote communication terminals, via the communication device 104.

The storage 105 saves the operating system of the computer 100, the program, data necessary to execute the program and data generated by the program. The storage 105 includes the main storage device and the external storage device. Examples of the main storage device include RAM, DRAM and SRAM. However, the type of device used as the main storage device is not limited. Also, examples of the external storage device include HDD, optical discs, flash memory and magnetic tapes. However, the type of device used as the external storage is not limited.

The computer 100 may include a plurality of processors 101, input devices 102, displays 103, communication devices 104 and storage 105. The computer 100 may be connected to peripheral devices such as printers or scanners.

The electronic apparatus 1 may include a single computer 100. The electronic apparatus 1 may include a plurality of computers which are communicable to with other computers.

The program may be stored in the storage 105 of the computer 100. The program may be stored in the external storage. The program may be uploaded to the Internet. By installing the program to the computer 100, the features of the electronic apparatus 1 become executable.

The terms used in the embodiments should be interpreted broadly. For example, the term "processor" may include a general-purpose processor, a central processor (CPU), a microprocessor, a digital signal processor (DSP), a controller, a micro-controller, and a state machine. Depending on situations, the "processor" may indicate an application specific integrated circuit, a field programmable gate array (FPGA), a programmable logic circuit (PLD), and the like. The "processor" may indicate a combination of processing devices such as a plurality of microprocessors, a combination of a DSP and a microprocessor, and one or more microprocessors cooperating with a DSP core.

As another example, the term "memory" may include any electronic component capable of storing electronic information. The "memory" can indicate a random access memory (RAM), a read only memory (ROM), a programmable read only memory (PROM), an erasable programmable read only memory (EPROM), an electrically erasable PROM (EEPROM), a nonvolatile random access memory (NVRAM), a flash memory, and a magnetic or optical data storage. The data saved in the devices mentioned above can be read by a processor. If the processor performs reads, writes or both reads and writes to the memory, the memory can be considered to be communicating electrically with the processor. The memory can be integrated with the processor. In such cases as well, the memory can be considered as communicating electrically with the processor.

The term "storage device" or "storage" may include any device that can store data using magnetic technology, optical technology, or nonvolatile memory. For example, the storage can be a HDD, an optical disk, a SSD, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic apparatus comprising:
   a light source configured to emit a pulse having a first output value and a first frequency response;
   a detector configured to detect a reflected wave of the pulse and convert the reflected wave to a first electric signal, wherein the reflected wave of the pulse is received after the pulse is reflected by an object;
   an equalizer configured to equalize the first electric signal using tap coefficients to generate a second electric signal, the tap coefficients are based on at least either one of the first output value and the first frequency response; and
   a processing circuitry configured to estimate a distance to the object based on the second electric signal.

2. The electronic apparatus according to claim 1, wherein the first frequency response is calculated by Fourier transformation of time domain waveform of the pulse.

3. The electronic apparatus according to claim 1, wherein the tap coefficients of the equalizer are determined based on a second output value of the equalizer and the first output value of the pulse.

4. The electronic apparatus according to claim 1, wherein the tap coefficients of the equalizer are determined based on a difference between the second output value of the equalizer and the first output value of the pulse.

5. The electronic apparatus according to claim 1, wherein the tap coefficients of the equalizer are determined ensuring that a difference between the second output value of the equalizer and the first output value of the pulse is minimized.

6. The electronic apparatus according to claim 1, wherein the tap coefficients of the equalizer are determined based on a waveform of the pulse emitted by the light source and the waveform of an third output signal of the detector.

7. The electronic apparatus according to claim 1, wherein the tap coefficients of the equalizer are determined to ensure that a waveform of an third output signal of the detector is shaped to the waveform of the pulse emitted by the light source.

8. The electronic apparatus according to claim 1, wherein the tap coefficients of the equalizer are determined based on the first frequency response and a second frequency response of the detector.

9. The electronic apparatus according to claim 1, wherein the tap coefficients of the equalizer are determined ensuring that an ensemble average of a squared value of a difference between a second output value of the equalizer and the first output value of the pulse emitted by the light source is minimized.

10. The electronic apparatus according to claim 1, wherein the tap coefficients of the equalizer are determined based on an impulse response calculated by an inverse Fourier transformation of third frequency response, the third frequency response is calculated by dividing the first frequency response with a second frequency response of the detector.

11. The electronic apparatus according to claim 10, wherein the second frequency response is a Fourier transformation of a response waveform generated when the detector detects a photon.

12. The electronic apparatus according to claim 11, wherein the response waveform is an exponential decay function.

13. The electronic apparatus according to claim 1, wherein the detector includes an avalanche photo diode configured to operate in Geiger mode.

14. The electronic apparatus according to claim 1, wherein the equalizer is either a Zero-Forcing equalizer or a Minimum Mean Square Error equalizer.

15. A distance measuring method comprising the steps of:
    a light source emitting a pulse of an electromagnetic wave;
    a detector detecting a reflected wave of the pulse, which is reflected by an object;
    the detector converting the reflected wave to a first electric signal;
    a processing circuitry determining tap coefficients of an equalizer based on an first output value of the pulse or a first frequency response of the pulse;
    the equalizer equalizing the first electric signal by using the tap coefficients and generating a second electric signal; and
    the processing circuitry estimating a distance between the object, based on the second electric signal.

16. The distance measuring method of claim 15, further comprising the step of:
    the processing circuitry determining the tap coefficients of the equalizer ensuring that an ensemble average of a squared value of a difference between a second output value of the equalizer and the first output value of the pulse emitted by the light source is minimized.

17. The distance measuring method of claim 15, further comprising the step of:
    the processing circuitry determining the tap coefficients of the equalizer determined based on an impulse response calculated by an inverse Fourier transformation of third frequency response, the third frequency response is calculated by dividing the first frequency response with a second frequency response of the detector.

* * * * *